United States Patent [19]
Weterings

[11] Patent Number: 5,430,751
[45] Date of Patent: Jul. 4, 1995

[54] SEMICONDUCTOR DIODE LASER AND METHOD OF MANUFACTURING SUCH A DIODE

[75] Inventor: Josephus P. Weterings, Eindhoven, Netherlands

[73] Assignee: U.S. Philips Corporation, New York, N.Y.

[21] Appl. No.: 200,134

[22] Filed: Feb. 22, 1994

[30] Foreign Application Priority Data

Feb. 22, 1993 [EP] European Pat. Off. ............ 93200496

[51] Int. Cl.⁶ .............................................. H01S 3/19
[52] U.S. Cl. ...................................... 372/49; 372/92; 372/108; 437/129
[58] Field of Search ................. 372/46, 96, 101, 49, 372/108, 92; 437/129

[56] References Cited

U.S. PATENT DOCUMENTS 4,935,939  6/1990  Liau et al. ........................... 372/101

FOREIGN PATENT DOCUMENTS 0143092 11/1980  Japan .................................. 372/101
0227091  9/1988  Japan .................................. 372/101
3119782  5/1991  Japan .

*Primary Examiner*—James W. Davie
*Attorney, Agent, or Firm*—Steven R. Biren

[57] ABSTRACT

The invention relates to a semiconductor diode laser whose strip-shaped active region is limited by an end face which is curved for forming a lens of a given strength. A disadvantage of the known diode is that it has a comparatively high starting current. This is found to be caused inter alia by the etching necessary for forming a curved end face. During etching, unevennesses arise in the curved end face where scattering of the generated radiation occurs. This increases the starting current of the diode. A diode according to the invention is characterized in that the curved end face is covered with a covering layer of a material having a refractive index different from that of the active layer, and the refractive index of the covering layer and the curvature of the end face are so chosen that the scattering of the generated radiation is a minimum for the given strength of the lens. The scattering is a minimum through a choice of the smallest possible difference in refractive index between the covering layer and the active layer, preferably below 0.5. Preferably, the radius of curvature of the end face is smaller than 2.5 μm. The covering layer preferably comprises a semiconductor material, for example, the same material as a cladding layer. In diode lasers with a lateral cladding layer, the latter layer and the covering layer may be provided in a single deposition step, which is very favourable. The invention, accordingly, also relates to a method of manufacturing diode lasers according to the invention.

10 Claims, 2 Drawing Sheets

SEMICONDUCTOR DIODE LASER AND METHOD OF MANUFACTURING SUCH A DIODE

BACKGROUND OF THE INVENTION

The invention relates to a semiconductor diode laser comprising a semiconductor body with a substrate of a first conductivity type and a semiconductor layer structure situated thereon and having an active layer arranged between two cladding layers and a pn junction by which electromagnetic radiation can be generated in a strip-shaped active region of the active layer given a sufficient current strength in the forward bias direction, an end face of the strip-shaped active region being curved so as to form a lens of a given strength. The invention also relates to a method of manufacturing such diode lasers.

Such diode lasers are used inter alia as components in read and/or write heads of information processing equipment such as laser printers, bar code readers, and read and/or write devices for optical registration carriers such as CD (Audio) and CDROM (Data) discs, and as transmitters in systems for optical glass fibre communication. In the latter systems, the semiconductor diode laser may also be constructed as an amplifier. Accordingly, the term laser in the present Application is explicitly understood also to cover a laser amplifier.

Such a diode laser is known from JP(A) 3-119.782 published in Patent Abstracts of Japan, vol. 15, no. 323 (E-1101) [4851] 16th Aug. 1991. The strength (P) of the lens is determined by the equation $P = \Delta n/R$ in which $\Delta n$ is the difference in refractive index between the active region 3 and the surrounding medium, i.e. air, and R is the radius of curvature of the curved end face. The said difference in refractive index is approximately 2.5, namely approximately 3.5−1. A lens strength which is usual in practice corresponds to a radius of curvature R which lies between approximately 10 and approximately 300 μm, often between 20 and 50 μm.

A disadvantage of the known device is that an increase in the starting current is often observed with the use of lasers having an active region with a curved end face as compared with similar lasers having a plane end face. Such an increase is obviously undesirable.

SUMMARY OF THE INVENTION

The present invention has for its object inter alia to provide a semiconductor diode laser which does not have the said disadvantage, or at least to a much lesser extent, and which accordingly exhibits no or substantially no increase in the starting current when a curved face is used as the end face of the active region.

According to the invention, a semiconductor diode laser of the kind mentioned in the opening paragraph is for this purpose characterized in that the curved end face is covered with a covering layer of a material having a different refractive index from that of the active region, and the refractive index of the material of the covering layer and the radius of curvature of the end face are so chosen that the scattering of the generated electromagnetic radiation at the curved end face is a minimum at the given lens strength. The invention is based inter alia on the following recognitions. A curved end face, which is often formed through etching, is slightly rough compared with a plane end face which is normally formed by cleaving. Owing to this roughness, scattering of the generated radiation takes place at the curved end face, which scattering is a cause of the increase in starting current. This scattering is comparatively great owing to the comparatively great difference in refractive index between the semiconductor material of the active layer and the surroundings (air or nitrogen). The provision of a covering layer on the curved end face with a refractive index closer to that of the active region suppresses the scattering. Also, the curvature of the end face is adapted for obtaining the given lens strength in the diode according to the invention in accordance with the cited equation for lens strength. For a comparatively small difference in refractive index between the covering layer and the active layer, this means that the curved end face has a comparatively small radius of curvature, i.e. a stronger curvature. Both concave and convex curvatures may be used. The curvature of the end face may be provided both in lateral direction (parallel to the active region) and in transverse direction (perpendicular to the active region).

In a major embodiment, the end face is curved in lateral direction and the coveting layer comprises a semiconductor layer having a refractive index smaller than the refractive index of the active region. The manufacture of the diode laser remains comparatively simple owing to the fact that the covering layer comprises a semiconductor material. In principle, the refractive index of the coveting layer may alternatively be greater than that of the active region. In practice, however, this means that the bandgap of the coveting layer is smaller than the bandgap of the active region, as a result of which the generated radiation is absorbed in the covering layer, which is often undesirable. The curvature in the lateral direction may result either in a concave or in a convex lens. In the former case, the issuing radiation beam becomes circular rather than elliptical (major axis perpendicular to the active layer), as in the case without a lens. As a result, external components, such as external lenses, can be simpler and cheaper. In the latter case, the issuing radiation beam initially becomes even more elliptical at smaller lens strengths. As a result, the coupling efficiency into, for example, a fibre of small diameter can be greater. In the case of greater lens strengths, the shape of the radiation beam also becomes more circular at a somewhat greater distance, also in the case of a convex lens. This has the advantage explained above for a concave lens. Finally, it is an advantage that such a lateral curvature may be provided by means of masks and etching in a comparatively simple manner.

An appreciable advantage is already obtained compared with the known diodes when the difference in refractive index between the active region and the coveting layer (layer) is below 2, while a radius of curvature smaller than 10 μm is chosen. Better results are obtained when the difference in refractive index between the active region and the coveting layer (layer) is smaller than 1, while a radius of curvature smaller than 5μ is chosen. The best results are obtained when the difference in refractive index between the active region is and the covering layer (layer) smaller than 0.5, for example approximately 0.3, while a radius of curvature smaller than 2.5 μm, for example approximately 1.5 μm, is chosen.

Preferably, the coveting layer comprises a semiconductor material which is identical to that of one of the cladding layers. This further simplifies the manufacture. This is especially true when the diode (laser) is of the so-called "buried ridge" or "buried hetero" type. In that case the active region is present in a mesa-shaped strip on either side of which a further, lateral cladding layer is present. When the coveting layer comprises the same semiconductor material as the further, lateral cladding layer then, both layers may be provided in a single process step, which renders manufacture inexpensive. Particularly favourable modifications comprise a diode laser of the DFB (=Disctributed Feed Back) type, comprise a radiation-guiding layer, and are formed in the InP/InGaAsP material system, in which the covering layer comprises a cleaving surface which is covered with an anti-reflection coating. In the case of DFB (or DBR) diode lasers, especially laser amplifiers, a very low mirror reflection is necessary for an effective suppression of the FP (=Fabry Perot) modes. An anti-reflection coating necessary for this may be provided in a much easier and more effective way on a plane mirror surface than on a curved surface. This is why the side of the covering layer facing away from the diode in this modification is formed by means of a cleaving surface.

According to the invention, a method of manufacturing a semiconductor diode laser whereby a semiconductor layer structure is provided on a substrate of a first conductivity type with an active layer situated between two cladding layers and with a pn junction with which electromagnetic radiation can be generated in a strip-shaped active region of the active layer given a sufficient current strength in the forward bias direction of the pn junction, while an end face of the strip-shaped active region is curved so as to form a lens of a given strength, is characterized in that the curved end face is covered with a covering layer of a material having a different refractive index from that of the active layer, and the refractive index of the material of the covering layer and the curvature of the end face are so chosen that the scattering of the generated electromagnetic radiation at the curved end face is a minimum for the given strength of the lens. The particularly attractive devices according to the invention are obtained by such a method.

A particularly favourable embodiment of a method according to the invention is characterized in that a strip-shaped mesa is formed in the semiconductor layer structure by means of etching after the provision of a mask, which mesa comprises at least the upper cladding layer and the active layer, the end face is formed and provided with a curvature, after which in a single deposition step a further cladding layer is provided to either side of the mesa and the covering layer is provided against the curved end face, and finally separate diodes are obtained through cleaving, a cleaving surface being made through the covering layer. The lasers of the buried hetero type, which are attractive in practice, are given lenses according to the invention in a very simple manner by such a method. The desired curvature of the end face is simply obtained in that the corresponding portion of the mask is given the desired curvature or shape. Thus convex or concave curvatures may be obtained in a simple manner. Any underetching which may occur during etching of the mesa may be simply anticipated in the formation of convex curvatures in that the shape of the mask is adapted, i.e. a more rectangular shape of the mask is chosen. This method is less suitable for obtaining concave curvatures when underetching occurs during etching of the mesa. This is one of the cases in which a modification of a method according to the invention described below may advantageously be applied.

In a further favourable embodiment, a strip-shaped mesa is formed in the semiconductor layer structure by etching after the provision of a first mask, which mesa comprises at least a portion of the upper cladding layer, after which in a deposition step a further (lateral) cladding layer is provided on either side of the mesa, and subsequently after the provision of a second mask an opening is etched into the semiconductor layer structure at the area of the mesa whereby at least the upper cladding layer and the active layer are removed and the end face of the mesa is shaped and provided with a curvature, after which the covering layer is provided against the end face by means of a further deposition step and finally separate diodes are obtained through cleaving, a cleaving surface being effected through the covering layer. Devices of the buried ridge or of the buried hetero type, which are very attractive in practice, are provided with lenses according to the invention in a simple manner by such a method. The (lateral) curvature is obtained in that the second mask is provided with suitable openings: when the openings are hourglass-shaped, a convex curvature is obtained. When the openings are circular, a concave curvature is obtained. Especially in the latter case, the resulting concave curvature is comparatively insensitive to the effect of underetching.

In a further modification, a periodic variation of the refractive index is provided within the amplification profile of the active layer and in the longitudinal direction of the strip-shaped active region. Lasers of the DFB or DBR type are obtained thereby which may be advantageously used especially in glass fibre communication systems.

BRIEF DESCRIPTION OF THE DRAWINGS

The invention will now be explained in more detail with reference to an embodiment and the accompanying drawing, in which.

The Figures are diagrammatic and not drown to scale, the dimensions in the thickness direction being particularly strongly exaggerated for greater clarity.

DESCRIPTION OF THE PREFERRED EMBODIMENT

Figure 1:
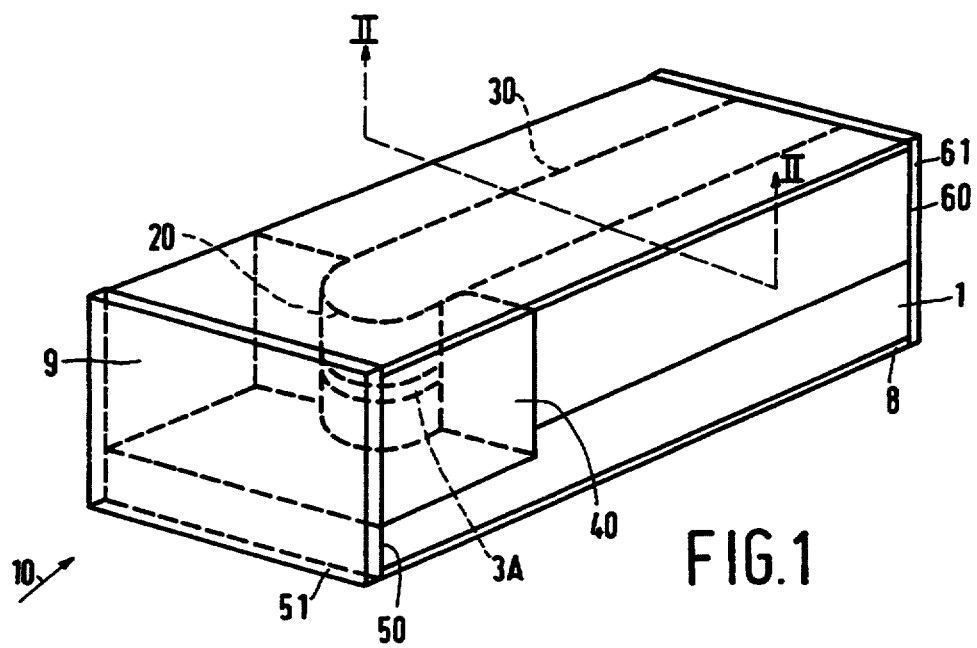
FIG. 1 diagrammatically and in perspective view shows an embodiment of a semiconductor diode laser according to the invention.
Figure 2:
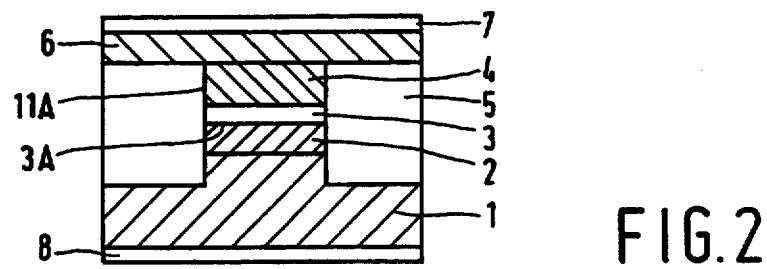
FIG. 2 diagrammatically and in cross-section taken on the line II—II shows the diode of FIG. 1.

FIG. 1 diagrammatically and in perspective view shows a semiconductor diode laser, according to the invention. A diagrammatic cross-section of the laser of FIG. 1 taken on the line II—II is shown in FIG. 2. The laser of FIG. 1 comprises a semiconductor body 10 with a substrate 1 of a first, here the n-conductivity type provided with a metal layer 8 on which a semiconductor layer structure is present with an active layer 3 (see FIG. 2) arranged between two cladding layers 2, 4 and with a pn junction, here between the cladding layers 2 and 4 which are of the first and of a second, opposed conductivity type, here the p-type, respectively. Given a sufficient current strength in the forward bias direction, electromagnetic radiation can be generated by the pn junction within a strip-shaped active region 3A of the active layer 3 situated below the strip designated 30 on the upper surface. One of the end faces 20 of the strip-shaped active region 3A is curved so as to form a lens of a certain strength. According to the invention, the curved end face 20 is covered with a covering layer 9 of a material having a different refractive index from that of the active layer 3, while the refractive index of the material of the covering layer 9 and the radius of curvature of the end face 20 are so chosen that the scattering of the generated radiation at the curved end face 20 is a minimum at the given lens strength. Owing to the small scattering, the starting current of the diode according to the invention is not or at least substantially not increased as compared with the known diode which is not provided with a coveting layer. The refractive index of the covering layer 9 is lower here than that of the active layer 3 and the end face 20 is curved laterally here. Absorption of the generated radiation in the covering layer 9 is avoided thereby, and a lens is obtained which gives the radiation beam issuing from the diode a more circular-symmetrical profile, which is of major advantage for many applications. A noticeable decrease in the scattering is found already when the difference in refractive index between the active layer 3 and the coveting layer 9 is smaller than approximately 2. This is accompanied by a radius of curvature smaller than or equal to 10/μm for obtaining a lens strength which is useful in practice. Better results are obtained with a refractive index difference below 1 and a radius of curvature below 5 μm, and even better results when the refractive index difference is smaller than 0.5 and the radius of curvature smaller than 2.5/μm. In the present example, the refractive index of the covering layer 9 is approximately 3.2 and the refractive index of the active layer 3 is approximately 3.5, so a difference of 0.3, while the radius of curvature of the end face 20 is approximately 1 μm here.

The width of the active region 3A is approximately 2 μm, which corresponds to the width of the mesa 11A. Preferably, the covering layer 9 comprises a semiconductor material, as in the present example, whereby the manufacture of the diode is kept simple. The diode here is of the so-called "buried hetero" type, and the coveting layer 9 comprises the same material as a further, lateral cladding layer 5 which is present on either side of the mesa 11A. All cladding layers 2, 4, 5 and the coveting layer 9 in this case comprise InP. The cladding layers 2 and 4 are of the n-and p-conductivity type, respectively, and each approximately 1 μm thick, whereas the lateral cladding layer 5 and the covering layer 9, which are advantageously provided in one and the same process step in this example, comprise high-ohmic InP and are approximately 3 μm thick. This latter thickness corresponds to the height of the strip-shaped mesa 11A which comprises besides the cladding layers 2, 4 and the active layer 3 also an approximately 1 μm thick portion of the substrate of n-type InP. The active layer 3 has a thickness of approximately 0.15 μm and comprises InGaAsP, corresponding to an emission wavelength of approximately 1.5 μm. A grating—not shown—is provided in the upper side of the cladding layer 2 perpendicular to the active region 3A, so that the diode laser in this example is of the DFB type. It is highly desirable for such a diode to operate in the SLM (=Single Longitudinal Mode). Accordingly, the planes 50 and 60 which bound the strip-shaped active region 3A on the outside in the longitudinal direction thereof are covered here with an anti-reflection coating 51, 61 which comprises, for example, ¼λ hafnium oxide, while in the centre of the grating (not shown in the Figures) a so-called ¼λ phase shift is present. The planes 50 and 60 are formed by means of cleaving through the coveting layer 9.

A contact layer 6, here of p-InGaAsP, is situated above the strip-shaped mesa 11A and the lateral cladding layer 5. On top of this there is a conductive layer 7 which is provided with a connection conductor (not shown) as is a conductive layer 8, by means of which current can be supplied to the diode, which current concentrates mainly in the strip-shaped active region 3A. The radiation issuing at the plane 50 is available for use. This radiation is guided, for example, into a glass fibre in a system for optical glass fibre communication. Thanks to the substantially circular-symmetrical cross-section of the issuing radiation, the latter can be coupled into the glass fibre easily and by comparatively cheap means such as a convex lens.

The semiconductor diode laser described is manufactured as follows by a method according to the invention. The method starts with a substrate 1 of n-type InP with a thickness of approximately 360 μm, a (100) orientation and a doping concentration of, for example, $5 \times 10^{18}$ atoms per $cm^3$. The substrate may at the same time act as a cladding layer in the InP/InGaAsP material system, and in the present example the substrate 1 is at the same time the first cladding layer 1. A diffraction grating, not shown in the Figures, is etched into the substrate 1 with a grating constant of approximately 240 nm. For this purpose, a photoresist layer of a thickness of approximately 100 nm is first provided on the upper surface. A raster pattern is formed in this photoresist layer by means of holographic illumination, using the 363.8 nm line of an argon laser. This pattern is used as a mask in an etching process in which the upper surface of the substrate is etched into a pattern of parallel grooves, for example, by means of a solution of hydrogen bromide (HBr) and bromine ($Br_2$) in water in a composition of $H_2O:HBr:Br_2=60:30:1$ volume parts. After removal of the photoresist, an approximately 0.15 μm thick layer 2 with the composition $In_{0.72}Ga_{0.28}As_{0.60}P_{0.40}(\lambda=1.3$ μm) is provided in this example by means of a growing technique, here by means of LPE (=Liquid Phase Epitaxy), which layer entirely fills up the grooves in the substrate 1. Then, possibly preceded by a thin radiation-guiding layer, an approximately 0.15 μm thick active layer 3 of not purposely doped $In_{0.57}Ga_{0.43}As_{0.91}P_{0.09}(\lambda=1.55$ μm) and a second cladding layer 4, here an approximately 0.10 μm thick InP layer 4 with a doping of $5 \times 10^{17}$ Zn atoms/$cm^3$ are provided.

Figure 3:
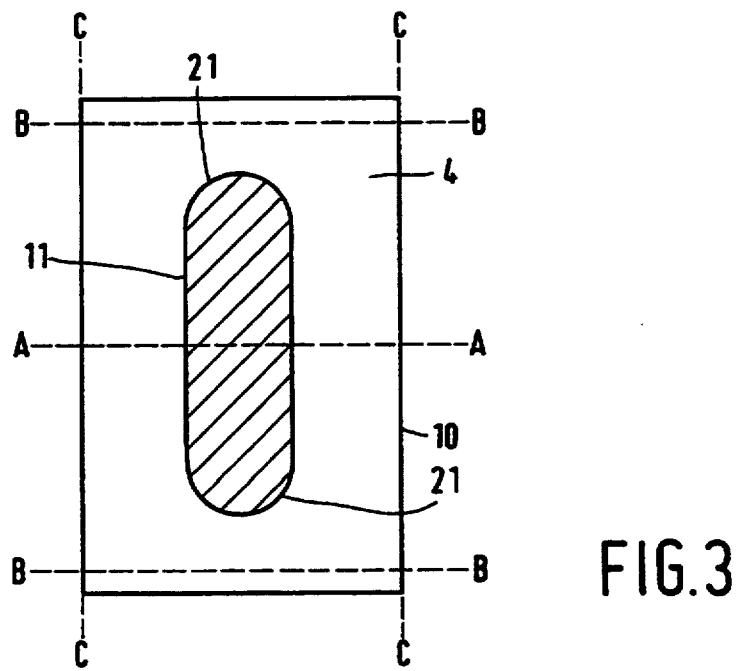
FIG. 3 diagrammatically and in plan view shows the diode of FIG. 1 in a stage of manufacture by a first embodiment of a method according to the invention.

After the device has been removed from the growing equipment, a masking layer of silicon dioxide ($SiO_2$) is provided, for example by sputtering. Then the masking layer (see FIG. 3) is removed for the major part in a usual manner, resulting in the strip-shaped mask 11 which is approximately 2 μm wide and approximately 600 μm long and whose ends 21 are provided with a curvature with a radius of approximately 1 μm. Subsequently, the semiconductor layer structure and a thin, i.e. approximately 1 μm thick portion of the substrate 1 is removed by etching, here RIE (=Reactive Ion Etching) outside the mask 11, so that a mesa 11A (see FIG. 2) is formed. After cleaning in a usual manner, the structure obtained is brought into a growing apparatus again according to the invention, and the lateral cladding layer 5 and the covering layer 9, both comprising high-ohmic InP here, are locally provided in a single selective growing process, here by means of MOVPE (=Metal Organic Vapour Phase Epitaxy) and by means of the mask 11. The refractive index of the covering layer 9 is made slightly lower than that of the active layer 3, and the refractive index of the covering layer 9 and the curvature of the end face 20 of the mesa 11A are so chosen that the scattering of the generated radiation at the curved end face 20 of the mesa 11A is a minimum for the given lens strength—which is determined by the difference in refractive index and the curvature.

After removal from the growing equipment and removal of the mask 11, the device is placed in the (MOVPE) growing apparatus again and an approximately 1 μm thick conductive layer 6 of p-type InGaAsP with a doping of approximately $1 \times 10^{19}$ at/cm$^3$ is provided over the entire upper surface.

After the structure thus obtained has been taken from the growing apparatus, metal layers 4 and 3 of usual composition, on which electrical connections may be made, are provided in usual manner at the upper and lower side of the semiconductor body 100. After this, the substrate is cleaved in the locations referenced AA and BB in FIG. 3, and the resulting strips are provided with an anti-reflection coating 51, 61, for example, of hafnium oxide, by means of, for example, sputtering or vapour deposition. Finally, individual diodes are obtained by cleaving in the locations referenced CC in FIG. 3.

Figure 4:
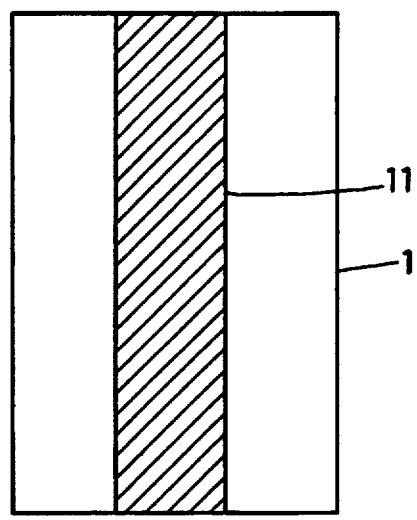
FIGS. 4 and 5 diagrammatically and in plan view show a modification of the diode of FIG. 1 in consecutive stages of manufacture by a second embodiment of a method according to the invention.
Figure 5:
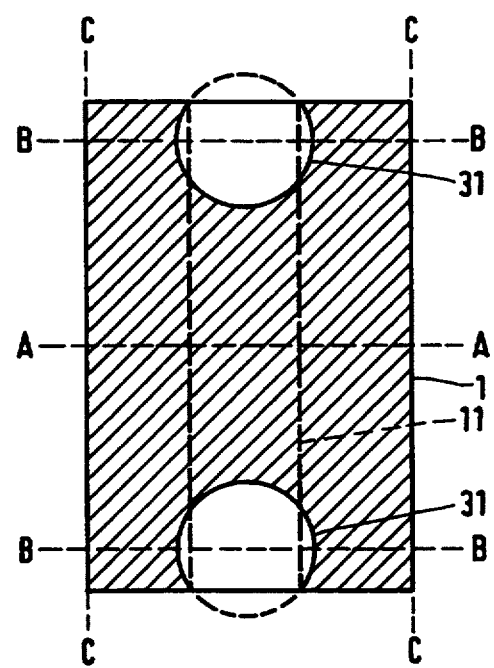

FIGS. 4 and 5 diagrammatically and in plan view show a modification of the diode of FIG. 1 in consecutive stages of manufacture by a second embodiment of a method according to the invention. A first difference with the method described above relates to the choice of the mask 11. In this embodiment, an uninterrupted strip-shaped mask 11 is chosen as the mask 11 (see FIG. 4). After etching of the strip-shaped mesa 11A, the structure obtained is placed in a growing apparatus again according to the invention and the lateral cladding layer 5, comprising high-ohmic InP here, is provided in a (selective) deposition step, here MOVPE, by means of the mask 11. After removal from the growing apparatus, a second mask 31 is provided on the semiconductor layer structure, which mask has openings, circular openings in this case, at the area of the mesa 11A. Openings 31 are etched into the semiconductor structure then through these openings 31, at least the upper cladding layer 4 and the active layer 3 being removed thereby, while the end face 20 of the mesa is shaped and provided with a curvature, here a concave curvature. After removal of the mask 31, the further manufacture proceeds as described above for the first embodiment of a method according to the invention. This second embodiment of a method is suitable for all types of lasers, including those of the buried ridge as well as those of the buried hetero type, and the method is also suitable for obtaining concave as well as convex end faces. This method is most suitable, however, for obtaining diodes with concavely curved end faces because the adverse influence of any underetching effect on a concave curvature of the end face is comparatively small in this method.

The invention is not limited to the embodiments given, since many modifications and variations are possible to those skilled in the an within the scope of the invention. Thus different thicknesses, different semiconductor materials, or compositions other than those mentioned in the examples may be used. It is especially noted that the invention may also be applied in the GaAs/AlGaAs and InGaP/InAlGaP material systems. It is further noted that the invention may be used not only in the SIPBH (=Semi Insulating Planar Buried Hetero) structure described in the example, but also in other laser structures such as the DCPBH (=Double Channel Planar Buried Hetero) structure. The invention may also be used to great advantage in laser structures of the—whether or not buried—ridge type. It is not even necessary for the active region to be formed or partly formed by a mesa. The invention may be used advantageously in, for example, a so-called oxide strip laser. Finally, it is noted that alternative growing techniques may be used, such as VPE (=Vapour Phase Epitaxy) or MBE (=Molecular Beam Epitaxy) in a method according to the invention instead of LPE and MOVPE. Instead of combinations of growing processes—as in the example given—it is often also possible to use an identical growing process for the different deposition steps.

I claim:

1. A semiconductor diode laser comprising a semiconductor body (10) with a substrate (1) of a first conductivity type and a semiconductor layer structure situated thereon and having an active layer (3) arranged between two cladding layers (1, 4) and a pn junction by which electromagnetic radiation can be generated in a strip-shaped active region (3A) of the active layer (3) given a sufficient current strength in the forward bias direction, an end face (20) of the strip-shaped active region (3A) being curved so as to form a lens of a given strength, characterized in that the curved end face (20) is covered with a covering layer (9) of a material having a different refractive index from that of the active region (3A), and the refractive index of the material of the covering layer (9) and the radius of curvature of the end face (20) are so chosen that the scattering of the generated electromagnetic radiation at the curved end face (20) is a minimum at the given lens strength.

2. A semiconductor diode laser as claimed in claim 1, characterized in that the end face (20) is curved in lateral direction and the covering layer (9) comprises a semiconductor material having a refractive index smaller than the refractive index of the active region (3A).

3. A semiconductor diode as claimed in claim 1, characterized in that the difference in refractive index between the active region (3A) and the covering layer (9) is below 2, and the radius of curvature of the curved end face (20) is smaller than 10 μm.

4. A semiconductor diode laser as claimed in claim 1, characterized in that the difference in refractive index between the active region (3A) and the covering layer (9) is smaller than 1, and the radius of curvature of the curved end face (20) is smaller than 5μ.

5. A semiconductor diode laser as claimed in claim 1, characterized in that the difference in refractive index between the active region (3A) and the covering layer (9) is smaller than 0.5, and the radius of curvature of the curved end face (20) is smaller than 2.5 μm.

6. A semiconductor diode laser as claimed in claim 1, characterized in that the semiconductor diode is a laser of the buried ridge type or of the buried hetero type, and the material of the covering layer (9) is the same as the material of the lateral cladding layer (5).

7. A semiconductor diode laser as claimed in any claim 1, characterized in that the semiconductor diode is a laser of the DFB type and the active layer (3) and a radiation-guiding layer (2) comprise InGaAsP, in that the cladding layers (1, 4, 5) and the covering layer (9) comprise InP, and in that the covering layer (9) is bounded at a side remote from the diode by a cleaving surface (50) provided with an anti-reflection coating (51).

8. A method of manufacturing a semiconductor diode laser comprising the steps of providing a semiconductor layer structure on a substrate (1) of a first conductivity type with an active layer (3) situated between two cladding layers (1, 4) and with a pn junction with which electromagnetic radiation can be generated in a strip-shaped active region (3A) of the active layer (3) given a sufficient current strength in the forward bias direction of the pn junction, curving an end face (20) of the strip-shaped active region (3A) so as to form a lens of a given strength, covering the curved end face (20) with a covering layer (9) of a material having a different refractive index from that of the active region (3A), and choosing the refractive index of the material of the covering layer (9) and the curvature of the end face (20) such that the scattering of the generated electromagnetic radiation at the curved end face (20) is a minimum for the given strength of the lens.

9. A method as claimed in claim 8, characterized in that a strip-shaped mesa (11A) is formed in the semiconductor layer structure by means of etching after the provision of a mask (11), which mesa comprises at least the upper cladding layer (4) and the active layer (3), the end face (20) is formed and provided with a curvature, after which in a single deposition step a further cladding layer (5) is provided to either side of the strip-shaped mesa (11A) and the covering layer (9) is provided against the curved end face (20), and finally separate diodes are obtained through cleaving, a cleaving surface (50) being made through the covering layer (9).

10. A method as claimed in claim 8, characterized in that a strip-shaped mesa (11A) is formed in the semiconductor layer structure by etching after the provision of a first mask (11), which mesa comprises at least a portion of the upper cladding layer (4), after which in a deposition step a further cladding layer (5) is provided on either side of the mesa (11A), and subsequently after the provision of a second mask (3 strip-shaped) an opening is etched into the semiconductor layer structure at the area of the mesa (11A), whereby at least the upper cladding layer (4) and the active layer (3) are removed and the end face (20) of the mesa is shaped and provided with a curvature, after which the covering layer (9) is provided against the end face (20) by means of a further deposition step, and finally separate diodes are obtained through cleaving, a cleaving surface (50) being effected through the covering layer (9).

* * * * *